United States Patent [19]

Huang et al.

[11] Patent Number: 5,552,346
[45] Date of Patent: Sep. 3, 1996

[54] PLANARIZATION AND ETCH BACK PROCESS FOR SEMICONDUCTOR LAYERS

[75] Inventors: Yuan-Chang Huang, Hsin-Chu; Chin-Kun Wang, San-Chung, both of Taiwan

[73] Assignee: Taiwan Semiconductor Manufacturing Co., Hsinchu, Taiwan

[21] Appl. No.: 429,811

[22] Filed: Apr. 27, 1995

[51] Int. Cl.$^6$ .................................. A01L 21/311
[52] U.S. Cl. .................... 437/228; 437/231; 156/643.1; 156/653.1
[58] Field of Search .................................. 437/225, 228, 437/231, 238; 156/643.1, 651.1, 652.1, 653.1

[56] References Cited

U.S. PATENT DOCUMENTS

| | | | |
|---|---|---|---|
| 4,214,946 | 7/1980 | Forget et al. | 156/643 |
| 4,492,620 | 1/1985 | Matsuo et al. | 204/192 |
| 4,962,063 | 10/1990 | Maydan et al. | 437/228 |
| 5,332,694 | 7/1994 | Suzuki | 437/195 |
| 5,399,533 | 3/1995 | Pramanik et al. | 437/228 |

OTHER PUBLICATIONS

"Improved Sub–Micron Inter–Metal Dielectric Gap–Filing Using TEOS/Ozone APCVD" by E. J. Korczyski et al, pub in Microelectronics Tech. Jan. 1992, pp. 22–27.
'Si Proc For The VLSI Era', Wolf, Stanley, vol. 2, (1990) Lattice Press.
'Improved Sub–U Inter–Metal . . . TEOS/$O_3$ APCVD', p. 22 E. J. Korczynski, Microelectronics Manufacturing Tech. (1992).

Primary Examiner—R. Bruce Breneman
Assistant Examiner—Matthew Whipple
Attorney, Agent, or Firm—George O. Saile; William J. Stoffel

[57] ABSTRACT

An improved process for planarization of an integrated circuit structure having raised portions is provided. A conformal insulating layer is deposited over the structure. Next, a sacrificial dielectric layer is formed over the insulating layer. A planarization layer is formed over the dielectric layer. Then, parts of the planarization layer, dielectric layer, and insulating layer are etched to planarize said integrated circuit structure using an etch chemistry which provides for an uniform etch rate through all three layers. The sacrificial dielectric layer and the etch chemistry provide uniform etching by eliminating micro loading effects.

17 Claims, 4 Drawing Sheets

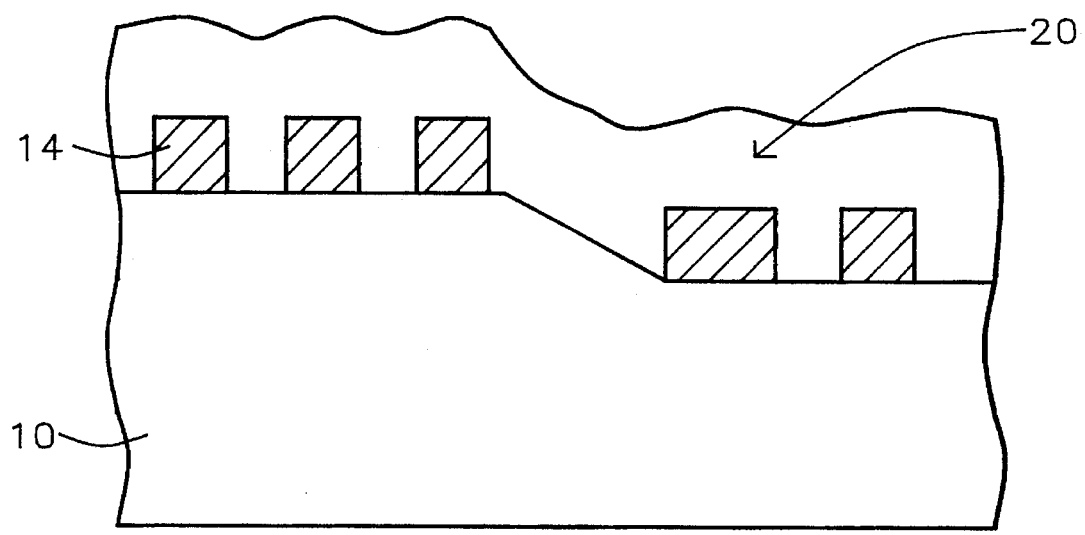
FIG. 1 - Prior Art
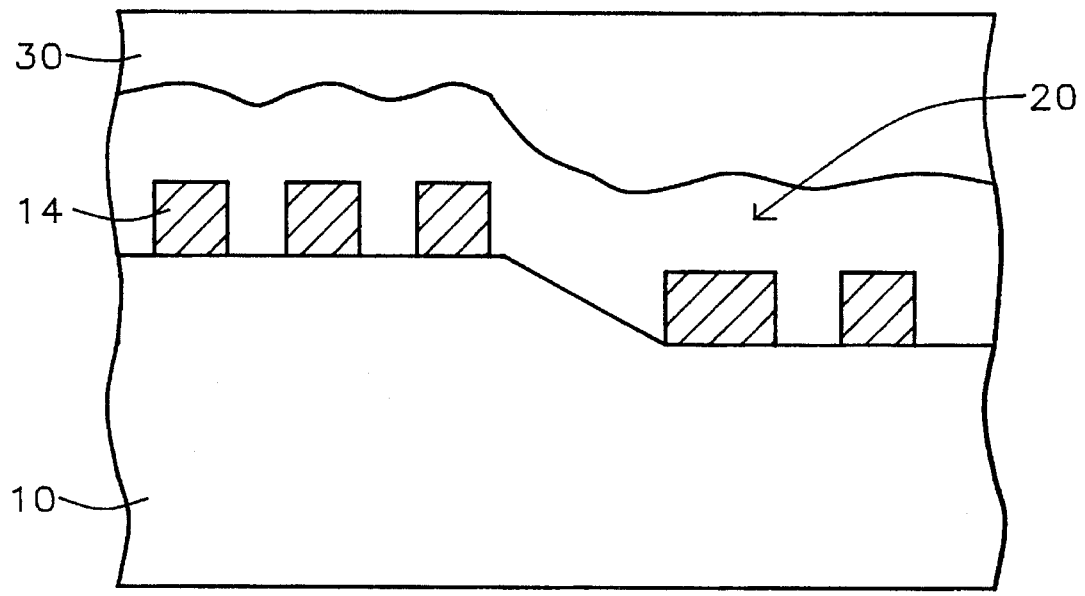
FIG. 2 - Prior Art

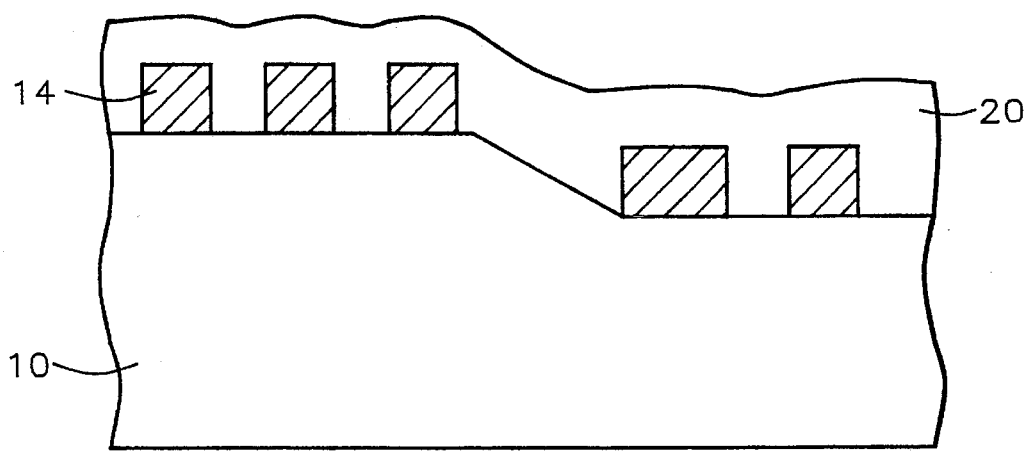
FIG. 3 – Prior Art
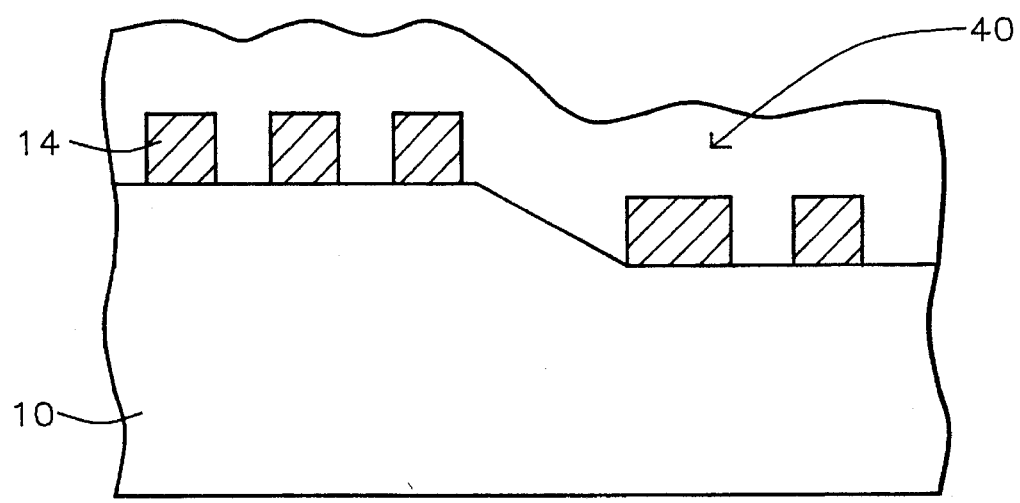
FIG. 4

PLANARIZATION AND ETCH BACK PROCESS FOR SEMICONDUCTOR LAYERS

BACKGROUND OF THE INVENTION

1. Field of the Invention

This invention relates to a planarization process for semiconductor integrated circuit structures. More particularly, this invention relates to an inter-metal-dielectric planarization process that utilizes a sacrificial dielectric layer and an etch back chemistry of $SF_6$ and $Cl_2$.

2. Description of the Prior Art

In the formation of integrated circuit structures, layers are patterned to form active devices, such as transistors, passive devices, such as resistors, and metal lines. This patterning of layers often creates uneven surfaces which can cause problems to subsequent overlying layers and devices.

Conventionally, a layer of insulating material, such as silicon oxide, is applied over such uneven surfaces to permit the formation of overlying patterned layers. However, the insulating layer (e.g., silicon oxide) tends to conform to the underlying topography resulting in the creation of a nonplanar or stepped surface. It is very difficult to pattern further layers over such an uneven surface using standard lithography techniques.

It has become the customary practice to apply planarizing layers of doped oxides, photoresist and organic-based glass materials, such as "SOG" (Spin On Glass). The insulating layer and the planarization layer are then anisotropically etched to remove the planarizing layer and raised sections of the underlying insulating layer.

However, the layers are not etched evenly because of a "loading effect" which results in a rough surface. The loading effect exists if the etch rate of a layer increases as the etching surface area decreases. Also the difference between the etch rates of the insulating layer and the planarization layer cause an even more uneven surface. Thus, achieving an equal etch rate of both the insulating layer (silicon oxide) and the planarizing layer is very difficult and the etch rate is dependent upon the geometry of the underlying structure.

FIG. 1 shows a process for planarization according to the prior art process. Raised portions 14, e.g., metal lines, are formed on an integrated circuit structure 10. Integrated circuit structure 10 can be a semiconductor wafer, including layers formed in and on the wafer. A conformal insulating layer 20, which may be formed of silicon oxide, is formed over the raised portions 14 and the integrate circuit structure 10. Conformal insulating layers composed of silicon oxide may be formed by $O_3$ TEOS processes or by electron cyclotron resonance (ECR) oxide plasma deposition as describe in U.S. Pat. No. 4,962,063, Mayden et al. since these oxides can fill-in small geometry volumes better than conventional oxides.

Next, a planarizating layer 30, which may be a doped oxide or spin on glass (SOG), is applied over conformal insulating layer 20 and then the coated structure is subjected to a planarizing etch step (e.g., an anisotropic dry etch) to remove some or all of the planarizing layer 30 and the high regions of the underlying insulating layer 20 as shown in FIG. 3.

However, this process provides a less than optimal planar insulating layer 20 surface as show in FIG. 3. The surface of the planarization layer 20 is not completely planar because of several problems inherent in the prior art process. One problem with the conventional process is that the planarization layer etch rate increases with an increase in the area of exposed silicon dioxide adjacent to the etch site. Therefore, the planarization layer etch rate and the selectivity (S) for any localized region on a wafer may not be constant throughout an etch process. This phenomenon is often referred to as "micro-loading". Moreover, the almost uncontrollable selectivity of planarization layer to insulating layer (oxide) causes uniformity problems, especially when using a $CHF_3$ and $CF_4$ etch. Moreover, because of the micro loading effect, the etch back rate of the planarization layer and the insulating layer must be carefully controlled to leave the proper amount of insulating layer over the raised portions.

These problems have prevented achievement of acceptable planarization for a patterned semiconductor structure. What is needed is an approach to planarization of topographies encountered in semiconductor processing that: provides relative insensitivity of planarization layer etch rates to changes in the amount of exposed insulating layer (oxide) area, provides more planar surfaces, and improves the controllability of the planarization process.

SUMMARY OF THE INVENTION

It is an object of this invention to furnish a process for planarizing an integrated circuit structure that provides improved planarization uniformity and controllable etch back rate, without substantially increasing costs and manufacturing complexity.

It is another object of the present invention to provide a process to planarize topographies encountered in semiconductor processing that has SOG etch rates that are relatively insensitive to the exposed area of underlying oxide and improves the reproducibility of the planarization process.

It is yet another object of the present invention to provide a process to planarize topographies encountered in semiconductor processing which reduces/prevents micro-loading effects and improves planarization.

Therefore, it is an object of this invention to provide a process for planarizing an integrated circuit structure comprising the deposition of a conformal insulating layer, a dielectric layer, and a planarizing material. Then planarizing the structure by etching the planarizing layer, dielectric layer and the insulating layer.

These and other objects of the invention will be come apparent from the following description and accompanying drawings.

In accordance with the above objectives, a process for the planarization of an integrated circuit structure is provide. The integrated circuit structure has portions on the surface of the integrated circuit structures that are higher than adjacent sections of the surface. The method comprises depositing an insulating layer over the structures. Next, a dielectric layer is formed over the insulating layer. A planarization layer is formed over the dielectric layer. Parts of the planarization layer, dielectric layer, and insulating layer are anisotropically etched to planarize the surface of the integrated circuit structure.

Preferably, the conformal layer is formed of silicon oxide, the dielectric layer is formed of silicon nitride and the planarization layer is formed of spin on glass. The preferable etch process uses $SF_6$ and $Cl_6$ etch gasses with a ratio of about 1:40 to 1:5, at an rf power of between 400 to 800 watts, and at a pressure of between 400 to 600 mTorr.

The present invention reduces/prevents the "micro loading effects" which are caused by the enhanced etch rate of the planarization layer adjacent to any exposed insulating layer (e.g., silicon oxide) during the etch back step. In the present invention, the novel sacrificial dielectric layer and the etch process ensure that the etch rates through the planarization layer, the dielectric layer, and the insulating layer are roughly equal. The micro loading effect is eliminated because during the planarization layer etch, the planarization layer is not adjoining the insulating layer thus preventing the enhanced planarization layer etch near any exposed insulating layer. The novel dielectric layer covers the insulating layer during the etch. The dielectric layer also ensures an equal etch rate between the planarization layer (e.g., SOG) and the dielectric layer with a minimal amount of polymer generated with the $SF_6$ and $Cl_2$ plasma etch. The process of the invention provides a easy to use, inexpensive, repeatable, uniform plantation process with a controllable etch back rate.

BRIEF DESCRIPTION OF THE DRAWINGS

The drawings show the following:

FIGS. 1 through 3 are schematic sectional views for explaining a conventional process for planarizing an insulating layer over an integrated circuit structure having raised portions.

FIGS. 4 through 8 are schematic sectional views for explaining the process of the present invention for planarizing an insulating layer over an integrated circuit structure having raised portions.

DETAILED DESCRIPTION OF THE PREFERRED EMBODIMENTS

The present invention will be described in detail with reference to the accompanying drawings. It should be noted that the drawings are in greatly simplified form. According to the present invention a method for planarization of an integrated circuit structure is provided. As shown in FIG. 4, the integrated circuit structure 10 has raised portions 14 on the surface of the structure that are higher than adjacent sections of the structure surface. The term "raised portions" means portions of an integrated circuit structure raised with respect to the height of the surface therebetween and thus may include not only structures raised with respect to the entire surface but also the raised sidewalls, for example, of a trench or slot with respect to the bottom of the trench. The raised portions 14 can comprise metal lines, polysilicon lines, and oxide interlayers.

A insulating layer 40 is formed over the structure. The conformal layer 40 can be composed of silicon oxide. The silicon oxide can be formed by an $O_3$ TEOS process or a plasma enhanced oxide (PE-OX) process for gap filling. A insulating layer composed of silicon oxide can be also be formed using electron cyclotron resonance (ECR) plasma deposition as described in U.S. Pat. No. 4,962,063, Maydan et al to which cross reference is hereby made. The preferred ECR process is a down stream divergent ECR with $Ar/O_2$ and $SiH_4$ deposition chemistry. The typical process parameters include microwave power between about 1000 to 3000 watts, rf power between about 2000 to 2500 w, a $SiH_4$ flow of about 180 sccm, an $O_2$ flow of about 90 SCCM, and an Ar flow of about 110 sccm.

The insulating layer 40 composed of silicon oxide can also be formed by decomposing tetraethylorthosilicate with oxygen and ozone $(O_2/O_3)$ at a temperature of between about 400° to 450° C. and at a pressure in the range of about 400 to 450 Torr. The insulating layer 40 can also comprise several layers of silicon oxide formed by different processes, such as a layer PE-OX layer followed by an $O_3$ TEOS oxide layer.

The layer 40 formed by the $O_3$ TEOS process can have a thickness in the range of about 7000 to 10,000 Å and more preferably a thickness in the range of about 8000 to 9000 Å. Also, the layer 40 formed by the ECR oxide process can have a thickness in the range of and between about 14,000 to 20,000 Å and more preferably a thickness in the range of about 15,000 to 17000 Å.

Figure 5:
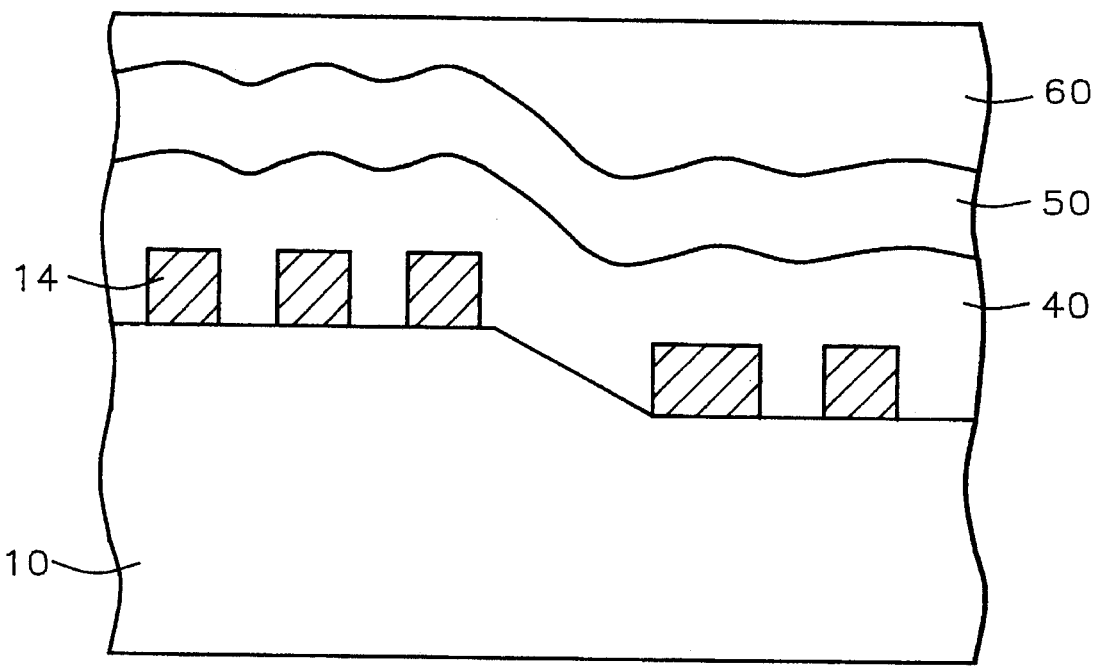

Next, a dielectric layer 50 is formed over the insulating layer 40 as shown in FIG. 5. The dielectric layer can be formed Of any suitable material that has an etch rate similar to the etch rates of the insulating layer 40 and the overlying planarization layer 60. The dielectric layer also should not create polymers during the subsequent etch back process. The selection of the material for the sacrificial dielectric layer 50 depends on the composition of the insulating layer 40, the planarization layer 60 and the etch back reactants. The dielectric layer 50 can be composed of silicon nitride. The dielectric layer 50 composed of silicon nitride can be formed using a low pressure chemical vapor deposition. The dielectric layer of silicon nitride can be formed by reacting silane and ammonia at atmospheric pressure at about 700° to 900° C., or by reacting dichlorosilane and ammonia at reduced pressure (LPCVD) at approximately 700° C. at a pressure in the range of about 200 to 1000 mTorr. Also, dielectric layer 40 composed of silicon nitride can be formed by plasma enhanced chemical vapor deposition by reacting silane With ammonia or nitrogen in a glow discharge between about 200° and 350° C.

The dielectric layer 50 is preferably formed of silicon nitride formed by a plasma enhanced deposition process at a pressure of about 400° C., a power of about 400 W, a pressure of about 600 mTorr, a $SiH_4$ flow rate of about 180 sccm, a $NH_3$ flow of about 65 sccm and a $N_2$ flow rate of about 2000 sccm.

The dielectric layer 50 can have a thickness in the range of about 5000 to 10,000 Å and a thickness more preferably in the range of about 7000 to 9000 Å.

Subsequently, a planarization layer 60 is formed over the dielectric layer 50 as shown in FIG. 5. The planarization layer 60 can be formed of photoresist or spin on glass. The planarization layer 60 is preferably formed of a spin on glass. The planarization layer 60 can have a thickness in the range of about 3000 to 8000 Å and more preferably a thickness in the range of about 5000 to 6000 Å.

A planarization layer 60 of spin on glass can be formed could be a siloxane which is preferred, or alternatively, a silicate type spin-on-glass material. The spin-on-glass material suspended in the vehicle or solvent is deposited onto the semiconductor wafer surface and uniformly spread thereover by the action of spinning the wafer, for example, at 3500 revolutions per minute. The material fills the indentations in the integrated circuit wafer surface, that is planarization. Then, most of the vehicle or solvent is driven off by a low temperature baking step. The wafer is heated to for example 80° C., 150° C., and 250° C.; or 80° C., 100° C., 150° C., 200° C., 250° C., and 300° C. for a duration of approximately two minutes each stage.

A curing step in a nitrogen or other inert atmosphere densities as well as cures the spin-on-glass layer to a silicon oxide structure. There is a typically a stabilization time of less than about 60 minutes and preferably about 50 minutes, followed by a less than about 30 minutes and preferably 15 minute ramp-up from about 370° C. to 425° C. The curing step is preferably at least about 60 minutes.

Figure 6:
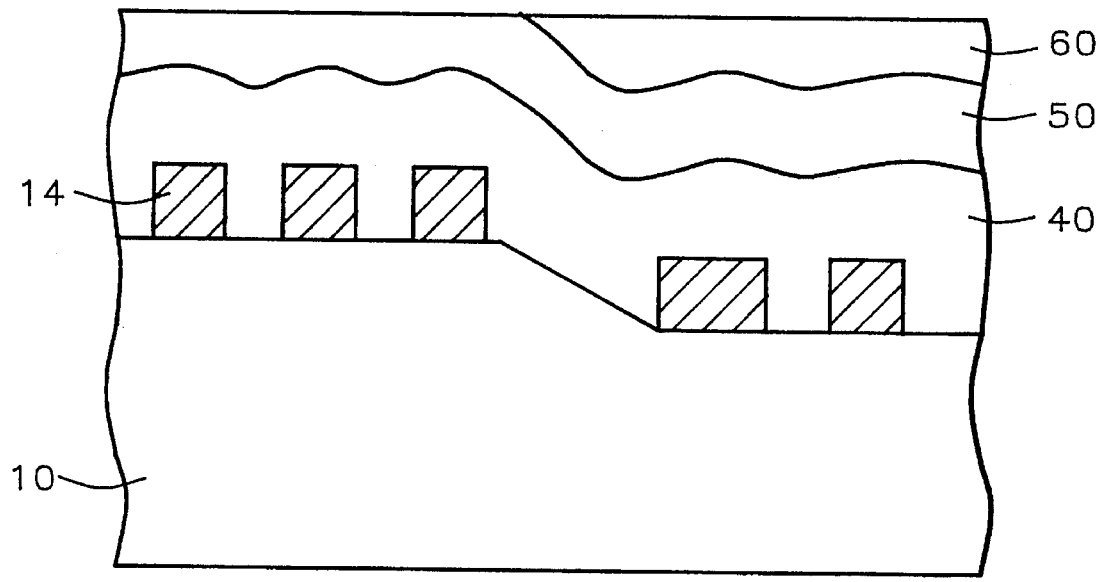
Figure 7:
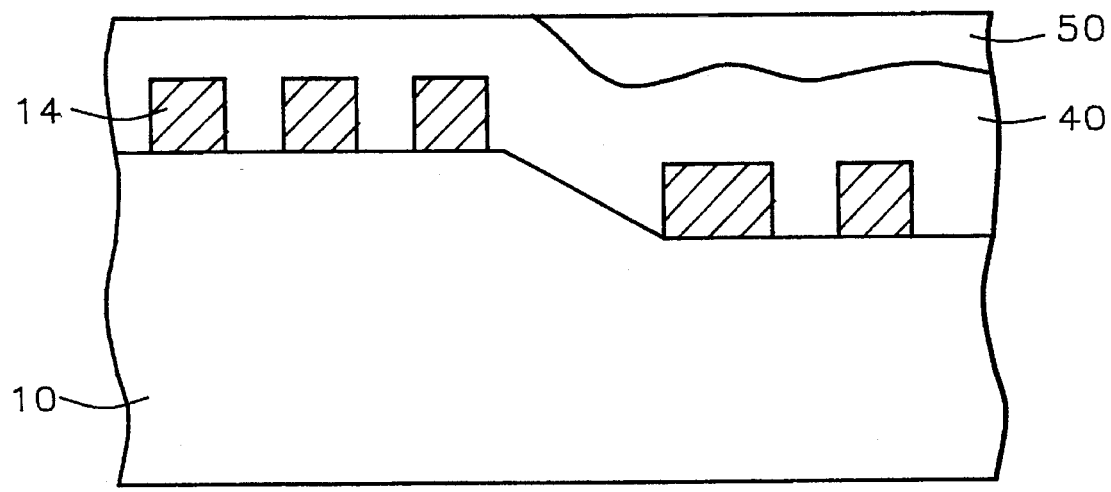
Figure 8:
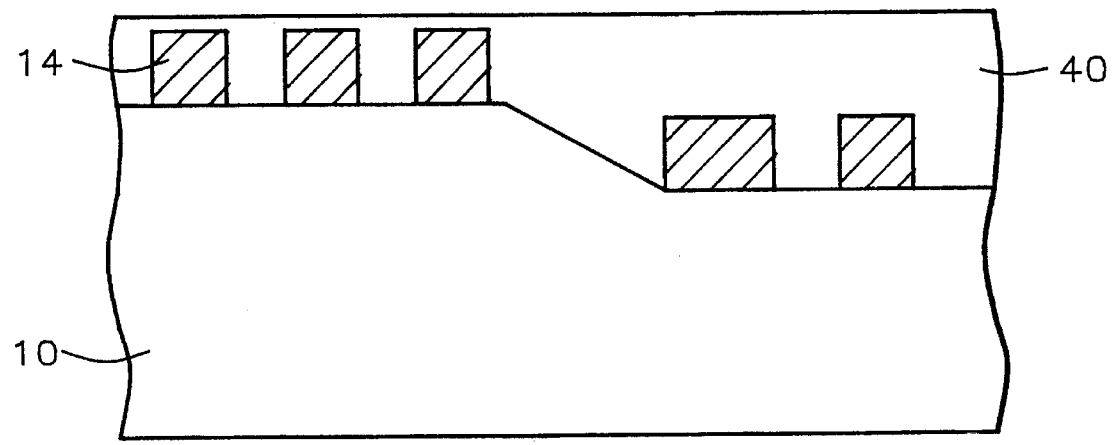

Portions of the planarization layer 60, dielectric layer 50, and conformal layer 40 are etched back to planarize the integrated circuit structure as shown in FIGS. 6 through 8.

The etching can be performed using fluorine containing process gasses such as $NF_3$, $CF_4$, and $SF_6$. The etching is preferably performed using $SF_6$ and $Cl_2$ gasses because other plasma etchants, such as $CF_4$ and $CHF_3$, generate Teflon™-type polymers which increase the micro loading effects when etching oxides and SOG layers.

The etching of the planarization layer, dielectric layer, and layer is performed using $SF_6$ and $Cl_2$ gasses with a ratio in the range of about 1:40 to 1:5 and more preferably using $SF_6$ and $Cl_2$ process gasses with a flow rate ratio (measured in sccm) in the range of about 5:200 to 5:100 and pressure of about 500 torr, at a rf power of about 400–800 watt RF and more preferably at about 500 W, and at a temperature between 20° to 50 °C.

The etch parameters are selected so that the etch rates of the planarization layer, dielectric layer, and the conformal layer are about the same. For this, a two step etch process can be used. First, planarization layer 60, and dielectric layer 50 are etched using $SF_6$ and $Cl_2$ gasses with a ratio in the range of about 5:200. As shown in FIGS. 6 and 7, most or all of the planarizing layer 60 is removed. The etcher can detect and stop etching when the planarizing layer 60 is removed. The etcher can detect the removal of the dielectric layer with an optical end point sensor. The sacrificial dielectric layer 50 has about the same etch rate as the planarization layer 60 and the insulating layer 40. The second etch step through the dielectric layer 50 and insulating layer 40 is performed using $SF_6$ and $Cl_2$ gasses with a ratio in the range of about 10:200, as shown in FIGS. 7 and 8. This two step etch produces almost equal etch rates through the three layers 60, 50, 40, thus producing a very planar surface on layer 40 as shown in FIG. 8. The sacrificial dielectric layer 50 should be thick enough to let etch remove the all of the planarization layer 50 before exposing the insulating layer 40.

The selectivity between the planarization layer 60 (e.g. spin-on-glass layer) and the dielectric layer 50 is in the range from about 0.9 to 1. The selectivity between the dielectric layer 50 and the insulating layer 40 is in the range from about 0.9 to 1.1.

Overall, the sacrificial dielectric layer 50 and the selected etch process ensure that the etch rates through the planarization layer, the dielectric layer, and the conformal layer are roughly equal. The dielectric layer prevents the micro loading effects by covering the insulating layer 40 and preventing the enhanced etching of the planarization layer 60 near any exposed insulating layer as shown in FIGS. 6 and 7. By the time the sacrificial dielectric layer is etched through, most or all of the planarization layer 60 is removed as shown in FIGS. 7 and 8.

The process of the invention provides an easy to use, inexpensive, repeatable, very uniform planarization process with a controllable etch back rate. The novel sacrificial dielectric layer and the etch process ensure that the etch rates through the planarization layer 60, the dielectric layer 50, and the conformal layer 40 are roughly equal. The present invention reduces/prevents the "micro loading effects" which are caused by the enhanced etch rate of the planarization layer adjacent to any exposed insulating layer (e.g., silicon oxide) during the etch back step. The micro loading effect is eliminated because during the planarization layer etch, the planarization layer is not adjoining the insulating layer thus preventing the enhanced planarization layer etch near any exposed insulating layer. The novel dielectric layer covers the insulating layer during the etch. The dielectric layer also ensures an equal etch rate between the planarization layer (e.g., SOG ) and the dielectric layer with a minimal amount of polymer generated with the $SF_6$ and $Cl_2$ plasma etch. This improves the planarization and the controllability and reproducibility of the planarization process.

While the invention has been particularly shown and described with reference to the preferred embodiments thereof, it will be understood by those skilled in the art that various changes in form and details may be made without departing from the spirit and scope of the invention.

What is claimed is:

1. A method for planarization of an integrated circuit structure, said structure having metallurgy lines having a given thickness; the method which comprises;
   (a) depositing a silicon oxide insulating layer over said structure having a thickness greater than said thickness of said metallurgy lines;
   (b) forming a silicon nitride dielectric layer over said insulating layer;
   (c) forming a spin on glass planarization layer over said insulating layer and said dielectric layers; and
   (d) etching portions of said planarization layer, dielectric layer, and insulating layer to planarize said insulating layer.

2. The method of claim 1 wherein depositing said insulating layer comprises depositing said insulating layer composed of silicon oxide formed by an electron cyclotron resonance plasma deposition.

3. The method of claim 1 wherein said insulating layer is formed by an electron cyclotron resonance plasma deposition having a thickness in the range of about 14,000 to 20,000 Å.

4. The method of claim 1 wherein depositing said insulating layer comprises depositing said insulating layer of silicon oxide by decomposing tetraethylorthosilicate with Oxygen and Ozone at a temperature of about 400° C.

5. The method of claim 1 wherein the insulating layer is formed by decomposing tetraethylorthosilicate with Oxygen and Ozone having thickness in the range of about 7000 to 10,000 Å.

6. The method of claim 1 wherein forming said dielectric layer comprises forming said dielectric layer composed of silicon nitride using a low pressure chemical vapor deposition.

7. The method of claim 1 wherein forming said dielectric layer comprises forming said dielectric layer composed of silicon nitride using a plasma enhanced chemical vapor deposition.

8. The method of claim 1 wherein the dielectric layer has a thickness in the range of about 7000 to 9000 Å.

9. The method of claim 1 wherein the planarization layer has a thickness in the range of about 5000 to 6000 Å.

10. The method of claim 1 wherein said etching of said planarization layer, dielectric layer; and insulating layer is performed using $SF_6$ and $Cl_2$ gasses.

11. The method of claim 1 wherein the etching of said planarization layer, dielectric layer, and insulating layer is performed using $SF_6$ and $Cl_2$ gasses with a ratio in the range of about 1:40 to 1:5 whereby the etch rates of the planarization layer, dielectric layer and the conformal layer, are about the same.

12. The method of claim 1 wherein the etching of said planarization layer, dielectric layer, and insulating layer is performed using $SF_6$ and $Cl_2$ gasses with a two step etch, the first etch step having a $SF_6$ to $Cl_2$ ratio in the range of about 5:200 and stopping the etching after said planarization layer is removed; and the second step having a $SF_6$ to $Cl_2$ ratio in the range of about 10:200 whereby the etch rates of the planarization layer, dielectric layer and the insulating layer, are about the same.

13. The method for planarization of an integrated circuit structure, said structure having metallurgy lines having a given thickness, the method which comprises;

(a) depositing a insulating layer of stoichiometric silicon oxide over said structure; said insulating layer having a thickness greater than said thickness of said metallurgy lines; said insulating layer having a thickness in the range between about 15,000 to 17,000 Å;

(b) forming a dielectric layer of silicon nitride over said insulating layer; said dielectric layer having a thickness in the range of between about 7000 to 9000 Å;

(c) forming a planarization layer of spin on glass over said insulating layer; said planarization layer having a thickness between about 5000 to 6000 Å; and (d) etching parts of said planarization layer, dielectric layer, and insulating layer with a two step etch, the first etch step having a $SF_6$ to $Cl_2$ ratio of about 5:200; and stopping the etching after said planarization layer is removed; and the second step having a $SF_6$ to $Cl_2$ ratio of about 10:200; whereby the etch rates of the planarization layer, dielectric layer, and the insulating layer are about the same.

14. The method of claim 13 wherein depositing said insulating layer comprises depositing said insulating layer composed of a silicon oxide formed by an electron cyclotron resonance plasma deposition.

15. The method of claim 13 wherein depositing said insulating layer comprises depositing said insulating layer of silicon oxide by decomposing tetraethylorthosilicate with Oxygen and Ozone ($O_2/O_3$) at a temperature of about 400° C.

16. The method of claim 13 wherein forming said dielectric layer comprises forming said dielectric layer composed of silicon nitride using a low pressure chemical vapor deposition.

17. The method of claim 13 wherein forming said dielectric layer comprises forming said dielectric layer composed of silicon nitride using a plasma enhanced chemical vapor deposition.

* * * * *